US006399666B1

(12) United States Patent
Hawker et al.

(10) Patent No.: US 6,399,666 B1
(45) **Date of Patent: *Jun. 4, 2002**

(54) INSULATIVE MATRIX MATERIAL

(75) Inventors: Craig Jon Hawker, Los Gatos; James Lupton Hedrick, Pleasanton; Andreas Heise, San Jose; David Mecerreyes, Santa Cruz; Robert Dennis Miller, San Jose; Olof Mikael Trollsås, Los Gatos, all of CA (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/238,357

(22) Filed: Jan. 27, 1999

(51) Int. Cl.[7] ...... C08J 9/00

(52) U.S. Cl. ...... 521/77; 521/154; 521/187; 521/168

(58) Field of Search ...... 521/76, 134, 154, 521/77, 187, 163

(56) References Cited

U.S. PATENT DOCUMENTS

| | | | |
|---|---|---|---|
| 3,547,839 | A | 12/1970 | Tocker |
| 3,732,181 | A | 5/1973 | Ray et al. |
| 3,900,320 | A | 8/1975 | Rolker et al. |
| 3,917,761 | A | 11/1975 | Scheuerlein et al. |
| 4,141,877 | A | 2/1979 | Luttinger et al. |
| 4,457,972 | A | 7/1984 | Griffith et al. |
| 4,535,099 | A | 8/1985 | Lee et al. |
| 4,623,463 | A | 11/1986 | Ford et al. |
| 4,761,233 | A | 8/1988 | Linder et al. |
| 4,920,402 | A | 4/1990 | Nakaya et al. |
| 5,036,145 | A | 7/1991 | Echterling et al. |
| 5,043,369 | A | 8/1991 | Bahn et al. |
| 5,114,826 | A | 5/1992 | Kwong et al. |
| 5,130,025 | A | 7/1992 | Lefebvre et al. |
| 5,183,607 | A | 2/1993 | Beall et al. |
| 5,188,777 | A | 2/1993 | Joesten et al. |
| 5,198,203 | A | 3/1993 | Kresge et al. |
| 5,206,337 | A | 4/1993 | Takeda et al. |

(List continued on next page.)

FOREIGN PATENT DOCUMENTS

| | | | |
|---|---|---|---|
| EP | 0 755 957 | A1 | 1/1997 |
| EP | 0 524 930 | B1 | 3/1997 |
| GB | 2 006 643 | A | 5/1979 |
| JP | 63-172741 | | 7/1988 |
| JP | 63-278943 | | 11/1988 |
| JP | 05205526 | A | 8/1993 |
| WO | WO 97/01593 | | 1/1997 |
| WO | WO 97/10193 | | 3/1997 |

OTHER PUBLICATIONS

Allen, G. et al., *Comprehensive Polymer Science. The Synthesis, Characterization, Reactions & Applications of Polymers*, vol. 1, pp. 17–18 and 34–37, Pergamon Press (Date Unknown).

(List continued on next page.)

*Primary Examiner*—James J. Seidleck
*Assistant Examiner*—Melanie Bagwell-Bissett
(74) *Attorney, Agent, or Firm*—Scully, Scott, Murphy & Presser; Daniel P. Morris

(57) ABSTRACT

The invention relates to a process for forming an integrated circuit device comprising (i) a substrate; (ii) metallic circuit lines positioned on the substrate and (iii) a dielectric material positioned on the circuit lines. The dielectric material comprises porous organic polysilica.

10 Claims, 3 Drawing Sheets

4
10
2
8

U.S. PATENT DOCUMENTS

| | | | | |
|---|---|---|---|---|
| 5,252,654 A | | 10/1993 | David et al. | |
| 5,288,842 A | | 2/1994 | Feger et al. | |
| 5,304,515 A | | 4/1994 | Morita et al. | |
| 5,384,376 A | | 1/1995 | Tunney et al. | |
| 5,412,016 A | | 5/1995 | Sharp | |
| 5,412,160 A | | 5/1995 | Yasumoto et al. | |
| 5,420,232 A | | 5/1995 | Dawson et al. | |
| 5,461,003 A | | 10/1995 | Havemann et al. | |
| 5,470,801 A | | 11/1995 | Kapoor et al. | |
| 5,498,689 A | | 3/1996 | Furuta et al. | |
| 5,521,424 A | | 5/1996 | Ueno et al. | |
| 5,523,615 A | | 6/1996 | Cho et al. | |
| 5,633,034 A | | 5/1997 | Carter et al. | |
| 5,658,994 A | | 8/1997 | Burgoyne, Jr. et al. | |
| 5,700,844 A | * | 12/1997 | Hedrick et al. | 521/77 |
| 5,747,381 A | | 5/1998 | Wu et al. | |
| 5,767,014 A | | 6/1998 | Hawker et al. | |
| 5,773,197 A | | 6/1998 | Carter et al. | |
| 5,895,263 A | * | 4/1999 | Carter et al. | 438/624 |
| 6,093,636 A | * | 6/2000 | Carter et al. | 428/623 |

OTHER PUBLICATIONS

Allen, G., et al., *Comprehensive Polymer Science. The Synthesis, Characterization, Reactions & Applications of Polymers*, vol. 3, pp. 34–37, Pergamon Press (Date Unknown).

Babich, E. et al., "Low Viscosity and High Temperature Stable Gap Filling Material for Glass/Ceramic Substrates", *IBM Technical Disclosure Bulletin*, 37(7):595–597 (Jul. 1994).

Chujo, Y., "Organic/Inorganic Polymer Hybrids", *Polymeric Materials Encyclopedia*, 6:4793–4798 (1996).

Chujo, Y. et al., "Organic Polymer Hybrids with Silica Gel Formed by Means of the Sol–Gel Method", *Advances in Polymer Science*, 100:11–29 (Feb. 25, 1991).

*Encyclopedia of Polymer Science and Engineering. Anionic Polymerization to Cationic Polymerization*, "Block Copolymers", 2:324–327, a Wiley—Interscience Publication (Date Unknown).

Fang, T. et al., "Polycyanate Esters: Science and Applications", *Prog. Polym. Sci.*, 20:61–118 (1995).

Frechet, J. et al., "Synthesis and Properties of Dendrimers and Hyperbranched Polymers", *Comprehensive Polymer Science*, Second Supplement, pp. 71–132, Pergamon (Date Unknown).

Gauthier, M. et al., "Uniform Highly Branched Polymers by Anionic Grafting: Arborescent Graft Polymers", *Macromolecules*, 24:4548–4553 (1991).

Hedrick, J., "Poly(aryl ether benzothiazoles)", *Macromolecules*, 24:6361–6364 (1991).

Hilborn, J. et al., "Poly(aryl ether–benzoxazoles)", *Macromolecules*, 23(11):2854–2861 (1990).

Homma, T. et al., "Stability of a new Polyimide Siloxane Film as Interlayer Dielectrics of ULSI Multilevel Interconnections", *Thin Solid Films*, 235:80–85 (1993).

Joseph, W. et al., "Synthesis of Bis—A Based Polybenzoxazoles via Acid—Catalyzed Solution Cyclization", *Polymer Reprints*, 33(1):501–502 (Apr. 1992).

Joseph, W. et al., "Synthesis of 4,4'–Isopropylidene Diphenol (Bisphenol A) Based Polybenzoxazoles via an Acid—Catalysed Solution Cyclization Process", *Polymer*, 34(4) (1993).

Joseph, W. et al., "Synthesis and Characterization of Fluorinated Polybenzoxazoles via Solution Cyclization Techniques", *Polymer Preprints*, 34(1):397–398 (Mar. 1993).

Joseph, W. et al., "Synthesis and Characterization of Fluorinated Polybenzoxazoles via Solution Cyclization Techniques", *Polymer*, 35(23):5046–5050 (1994).

Mascia, L., "Developments in Organic—Inorganic Polymeric Hybrids: Ceramers", *Trends in Polymer Science*, 3(2):61–66 (Feb. 1996).

McDermott, C., "Foamed Thermoset and Thermoplastic Polymer Combinations", *IBM Technical Disclosure Bulletin*, 8(12):1702 (May 1966).

Morikawa, A. et al., "Preparation of a New Class of Polymide—Silica Hybrid Films by Sol—Gel Process", *Polymer Journal*, 24(1):107–113 (1992).

Morikawa, A. et al., "Preparation of New Polyimide—Silica Hybrid Materials via the Sol—Gel Process", *J. Mater. Chem.*, 2(7):679–689 (1992).

Munroe, R., "Method for Curing and Holding Semiconductors for Organic Encapsulation", *IBM Technical Disclosure Bulletin*, 27(7A):4037–4038 (Dec. 1984).

Saegusa, T. et al., "An Organic/Inorganic Hybrid Polymer", *J. Macromol. Sci. Chem.*, A27:(13 & 14):1603–1612 (1990).

Tian, D. et al., "Ring—Opening Polymerization of 1,4, 8–Trioxaspiro[4,6]–9–undecanone: A New Route to Aliphatic Polyesters Bearing Functional Pendent Groups", *Macromolecules*, 30:406–409 (1997).

Tomalia, D. et al., "Comb–Burst Dendrimer Topology. New Macromolecular Architecture Derived from Dendritic Grafting", *Macromolecules*, 24:1435–1438 (1991).

Tomalia, D. et al., "Genealogically Directed Synthesis: Starburst/Cascade Dendrimers and Hyperbranched Structures", *Topics in Current Chemistry*, 165:193–313 (1993).

Volksen, W., "Condensation Polyimides: Synthesis, Solution Behavior, and Imidization Characteristics", *Advances in Polymer Science*, 117:138–139, 163 (1994).

Volksen, W. et al., "Polyamic Alkyl Esters: Versatile Polyimide Precursors for Improved Dielectric Coatings", *IEEE Transactions on Components, Hybrids and Manufacturing Technology* (IEEE Log No. 9104490) (1992).

* cited by examiner

INSULATIVE MATRIX MATERIAL

FIELD OF THE INVENTION

The invention relates generally to a process for manufacturing an integrated circuit device. More specifically, the invention relates to processes for manufacturing integrated circuit devices using porous organosilicate systems templated with fugitive polymeric unimolecular micelles.

BACKGROUND OF THE INVENTION

There is a continuing desire in the microelectronics industry to increase the circuit density in multilevel integrated circuit devices e.g., memory and logic chips, thereby increasing their performance and reducing their cost. In order to accomplish this goal, there is a desire to reduce the minimum feature size on the chip e.g., circuit linewidth, and also to decrease the dielectric constant of the interposed dielectric material to enable closer spacing of circuit lines without an increase in crosstalk and capacitive coupling. Further, there is a desire to reduce the dielectric constant of dielectric materials such as those utilized in the back end of the line (BEOL) portion of integrated circuit devices, which contain input/output circuitry, to reduce the requisite drive current and power consumption for the device. The present dielectric is silicon dioxide which has a dielectric constant of about 4.0.

This material has the requisite mechanical and thermal properties to withstand processing operations and thermal cycling associated with semiconductor manufacturing. However, it is desired that dielectric materials for future integrated circuit devices exhibit a lower dielectric constant (e.g., <3.0) than exhibited by current silicon dioxide.

It is therefore an object of the present invention to provide an improved integrated circuit device comprising an improved dielectric material.

Other objects and advantages of the invention will be apparent from the following disclosure.

SUMMARY OF THE INVENTION

The invention relates to a process for forming an integrated circuit device comprising (i) a substrate; (ii) interconnecting metallic circuit lines positioned on the substrate and (iii) a dielectric material positioned contiguous to the circuit lines (over and/or between the circuit lines). The dielectric material comprises a porous organic polysilica formed by the process of the invention. Preferably, the dielectric material has pore sizes of less than about 500 Å.

A general route to organic-inorganic hybrids with nanophase morphologies has been developed with the objective of ultimately templating nanoporosity in organosilicates. Our invention concerns the preparation of macromolecular micelles which organize in the organosilicate. However, the self-organization of amphiphilic macromolecular species is a dynamic process and difficult to control and achieve, particularly in a ternary mixture (i.e., polymer, organosilicate and solvent).

One key feature of our invention is the use of macromolecules with star, hyper-star and dendrimer-like star molecular architectures. If properly designed, the interior of the star would be hydrophobic and the exterior hydrophilic, and such macromolecules are, themselves, micelles (e.g. unimolecular micelles). As a consequence, the dynamics of the micelle formation process are eliminated using these unimolecular micelles. The processes involved in forming nanostructures in hybrids with organosilicates are also greatly simplified. The synthesis of the unimolecular micelles has been demonstrated by the preparation of poly(caprolactone)/poly(methyl methacrylate-co-hydroxyethyl methacrylate) copolymers with various levels of hydroxyethyl methacrylate to control the hydrophilicity. These copolymers are sufficiently thermally stable to allow vitrification of the organosilicate component in the hybrids, yet decompose quantitatively at elevated temperatures to leave behind the templated nonoporosity.

The invention uses covalently bound 3-dimensional molecules, or macromolecular assemblies, to create nanoporosity in thermosetting matrixes. The matrixes can be inorganic thermosets, silsesquioxanes, or organic silicas, or organic thermosetting resins such as SiLK which is available from Dow Chemical Company or others. In addition, all the pore generating materials have a 3-dimensional structure which results in a low level of self-interaction. This low level of self-interaction leads to a more homogeneous distribution of pore generating materials throughout the matrix with the ultimate objective being complete miscibility and nanometer-sized domains.

For most linear polymers, or typical polymer micelles, aggregation occurs during processing which leads to micron sized domains which are not compatible with our desired microelectronic applications. Another advantage of these 3-dimensional pore generators is that the functionality on the periphery, or surface layer, as well as in the interior can be accurately controlled and varied. This permits the interaction of these materials with the chosen matrix to be fine tuned in order to maximize miscibility and nanoscopic structure.

A more thorough disclosure of the invention is presented in the detailed description which follows and from the accompanying drawings.

DETAILED DESCRIPTION OF THE INVENTION

Figure 1:
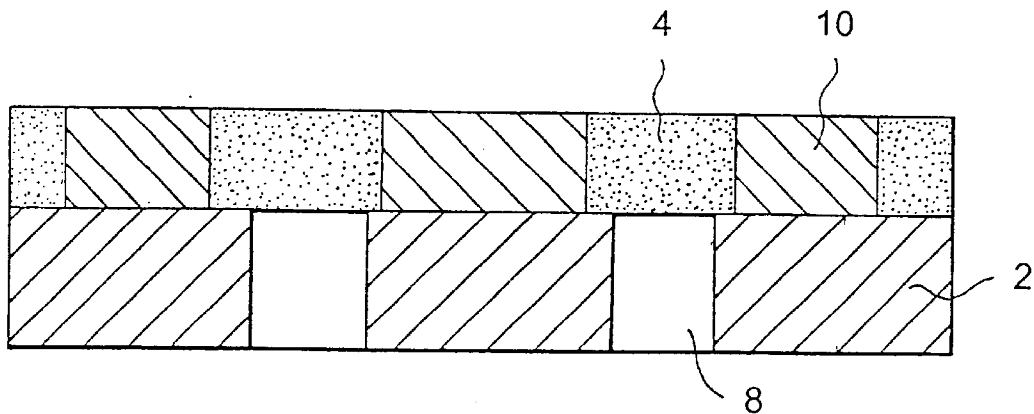
FIG. 1 is a cross-sectional view of a portion of the integrated circuit device formed by the process of the present invention.

An embodiment of the integrated circuit device formed by the process of the invention is shown in FIG. 1. The device generally comprises substrate 2, metallic circuit lines 4 and dielectric material 6. The substrate 2 has vertical metallic studs 8 formed therein. The interconnected circuit lines function to distribute electrical signals in the device and to provide power input to and signal output from the device. Suitable integrated circuit devices will generally comprise multiple layers of circuit lines which are interconnected by vertical metallic studs.

Suitable substrates for the device of the invention comprises silicon, silicon dioxide, glass, silicon nitride, ceramics, aluminum, copper, silicon/germanium, and gallium arsenide. Other suitable substrates will be known to those skilled in the art. In a multilayer integrated circuit device, an underlying layer of insulated, planarized circuit lines can also function as a substrate.

Suitable circuit lines generally comprise a metallic, electrically conductive, material such as copper, aluminum, tungsten, gold, silver, or alloys thereof. Optionally, the circuit lines may be coated with a metallic liner such as a layer of nickel, tantalum or chromium or other layers serving as barrier or adhesion layers (e.g., SiN, TiN, TaN etc).

The key feature of the invention is forming the dielectric material which is positioned over the circuit lines and/or between the circuit lines and on the substrate. In multilevel integrated circuit devices, the dielectric material is often planarized to function as a substrate for lithographic formation of the next layer of circuit lines. The dielectric material comprises porous organic polysilica or an organic thermoset.

Organic polysilica is a polymeric compound comprising silicon, carbon, oxygen and hydrogen atoms. Precursors which are useful in the formation of silica compounds in accordance with the invention include monoorganoalkoxysilanes, such as methyltrimethoxysilane, methyltrimethoxysilane, ethyltrimethoxysilane, ethyltriethoxysilane, propyltrimethoxysilane, propyltriethoxysilane, isobutyltrimethoxysilane, pentyltriethoxysilane, octyltriethoxysilane, octadecyltrimethoxysilane, octadecyltriethoxysilane, and, phenyltriethoxysilane; such as tetramethoxysilane, tetraethoxysilane, tetrapropoxysilane, tetraisopropoxysilane, tetrabutoxysilane, tetrakis(s-butoxy)silane, tetrakis (2-ethy-butoxy)silane, tetrakis(2-ethyl-hexoxy)silane, tetrakis(2-methoxy-ethoxy)silane, tetraphenoxysilane, hexaethoxydisiloxane, as well as ethysilicate and acyloxysilanes, such as tetracetoxysilane, methyltriacetoxysilane, ethyltriacetoxysilane, and di-t-butoxydiacetoxysilane.

Other suitable organic polysilica include (i) silsesquioxanes (ii) partially condensed alkoxysilanes (e.g., partially condensed by controlled hydrolysis tetraethoxysilane having an Mn of about 500 to 20,000); (iii) organically modified silicates having the composition $RSiO_3$ and $R_2SiO_2$ wherein R is an organic substituent and (iv) partially condensed orthosilicates having the composition $Si(OR)_4$. Silsesquioxanes are polymeric silicate materials of the type $RSiO_{1.5}$ where R is an organic substituent.

Suitable organic polysilica for use in the invention include silsesquioxanes. Suitable silsesquioxanes for the invention are alkyl (e.g., methyl); aryl (e.g., phenyl) or alkyl/aryl silsesquioxanes which are commercially available (e.g., GR950 from Techniglass, Perrysburg, Ohio). Other suitable silsesquioxanes are those disclosed in U.S. Pat. No. 5,384,376, and Chem. Rev. 95, 1409–1430 (1995), the disclosure of which are incorporated herein by reference for all purposes.

Porous thermosetting high temperature polymers are also useful as the ultimate dielectric layer. Polymers such as polyimides, polyarylenes, polyarylene ethers, polycyanurates, and the like, may be used in the invention and preferably have desirable dielectric properties. These polymers are easily synthesized and applied and are miscible at the molecular level prior to curing with the fugitive copolymers with which they are mixed.

One exemplary class of thermosetting polymers is polyarylenes. These polyarylenes may be synthesized from precursors such as ethynyl aromatic compounds of the formula:

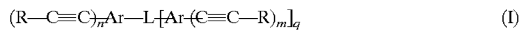

$$(R{-}C{\equiv}C)_n Ar{-}L[Ar(C{\equiv}C{-}R)_m]_q \quad (I)$$

wherein each Ar is an aromatic group or inertly-substituted aromatic group: each R is independently hydrogen, an alkyl, aryl or inertly-substituted alkyl or aryl group; L is a covalent bond or a group which links one Ar to at least one other Ar; n and m are integers of at least 2; and q is an integer of at least 1. As such, the ethynyl aromatic compounds of the invention have four or more ethynyl groups (for example, tetraethynyl aromatic compounds) and are useful as monomers in the preparation of polymers, including their oligomeric precursors.

In another aspect, the polyarylenes used in the invention may comprise a polymer, including copolymers, which comprise units of:

(II)

wherein Ar' is the residual of the reaction of product of $(C{\equiv}C)_n Ar$ or $Ar(C{\equiv}C)_m$ moieties and R and L are as defined above.

In one embodiment, the polyarylene copolymers of the invention comprise units of:

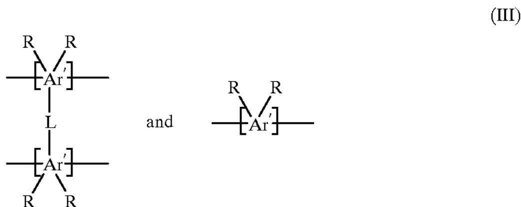

wherein Ar' and R are as hereinbefore defined.

Representative examples of compounds of the structure of Formula (I) include:

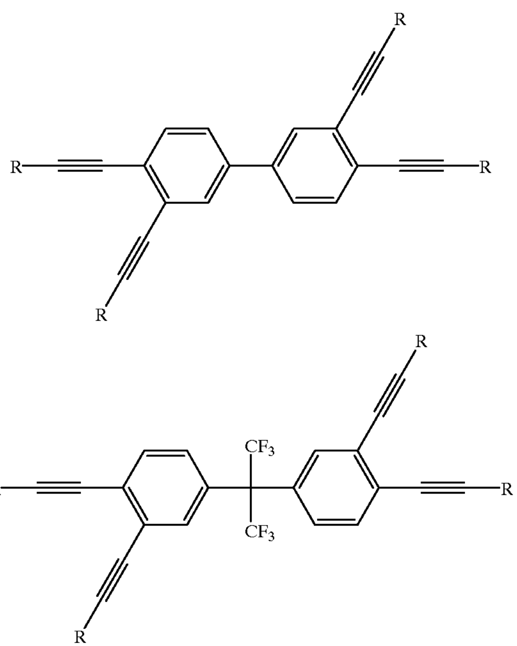

-continued

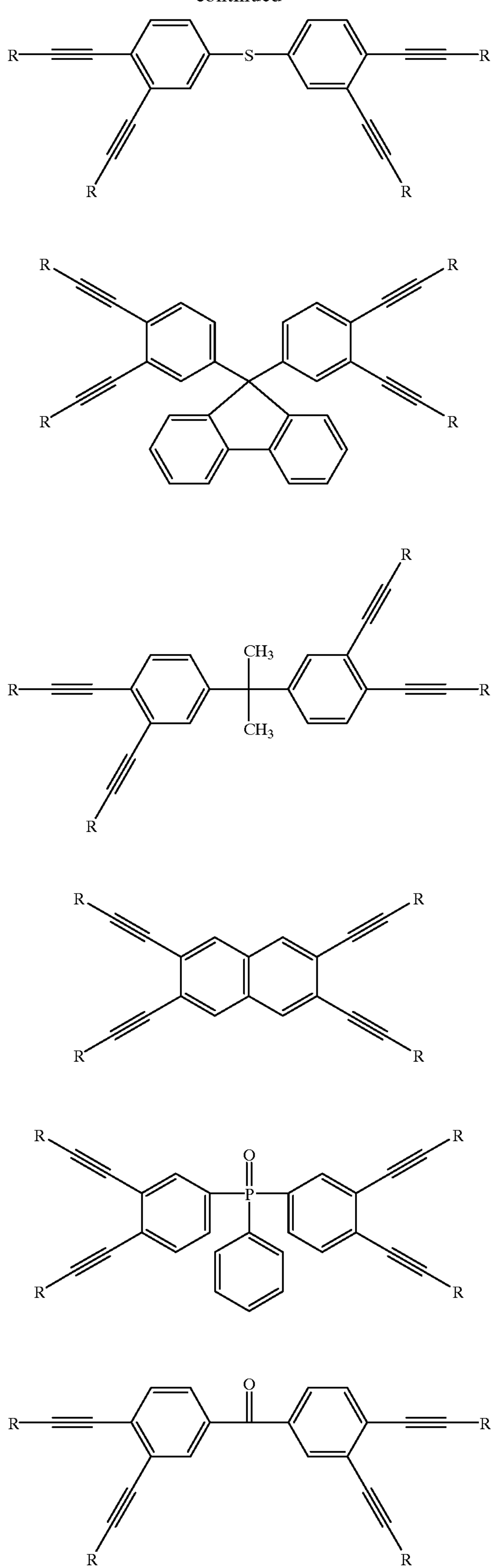

with Ar-L-Ar preferably being biphenyl such as biphenyl; 2,2-diphenyl propane; 9,9'-diphenyl fluorene; 2,2-diphenyl hexafluoro propane; diphenyl sulfide; oxydiphenylene; diphenyl ether; bis(phenylene)diphenylsilane; bis (phenylene) phosphine oxide; bis(phenylene)benzene; bis (phenylene)naphthalene; bis(phenylene)enthracene; thio-diphenylene; 1,1,1-triphenyleneethane; 1,3,5-triphenylene-benzene; 1,3,5-(2-phenylene-2-propyl)benzene; 1,1,1 -triphenylenemethane; 1,1,2,2-tetraphenylene- 1,2-diphenylethane; bis(1,1-diphenyleneethyl)benzene; 2,2'-diphenylene, 1,1,1,3,3,3-hexafluoropropane; 1,1-diphenylene-1-phenylethane; naphthalene; anthracene; or bis(phenylene)napthacene; more preferably biphenylene; naphthylene; p,p'(2,2-diphenylene propane) ($-C_6H_4-C(CH_3)_2-C_6H_4-$); p,p'—(2,2-diphenylene-1,1,1,3,3,3 hexafluoropropene) and ($-C_6H_4-C(CF_3)_2-C_6H_4-$).

Useful bis-phenyl derivatives include 2,2-diphenyl propane; 9,9'-diphenyl fluorene; 2,2-diphenyl hexafluoro propane; diphenyl sulfide; diphenyl ether; bis(phenylene) diphenylsilane; bis(phenylene) phosphine oxide; bis (phenylene)benzene; bis(phenylene)naphthalene; bis (phenylene)anthracene; or bis(phenylene)napthacene.

The ethynyl groups on each Ar are either on adjacent carbon atoms or are vinylogously conjugated within the ring. It is believed that they dimerize upon application of heat to form an aromatic ring having a 1,4-diradical which serves to polymerize and/or cross-link the compound. While not being bound by theory, it is believed that this dimerization occurs via Bergman cyclization such as disclosed by Warner, et al. in *Science,* 268, Aug. 11, 1995, pp. 814–816, which is incorporated herein by reference.

The ethynyl aromatic monomer precursors to thermosetting polyarylenes are preferably bis(o-diethynyl) monomers (herein also referred to as BODA (bis(ortho-diacetylene) monomers)), which means there are at least two sets of adjacent substituted or vinylogously conjugated ethynyl groups on the monomer, that is, at least one set of ethynyl groups on each Ar group. Preferably, the ethynyl aromatic compound contains from 2 to 4, most preferably 2 or 3, diethynyl sets, most preferably, except when additional cross-linking is desired. Two sets (that is, four) of ethynyl groups.

The polyarylene precursor monomers of the invention are advantageously prepared by:

(a) selectively halogenating, preferably in a solvent, a polyphenol (preferably a bisphenol) to selectively halogenate, preferably brominate, each phenolic ring with one halogen on one of the two positions ortho to the phenolic —OH group;

(b) converting the phenolic —OH on the resulting poly (ortho-halophenol), preferably in a solvent, to a leaving group such as a sulfonate ester (for example, a trifluoromethanesulfonate ester prepared from trifluoromethanesulfonyl halide or trifluoromethane sulfonic acid anhydride) which is reactive with and replaced by terminal ethynyl compounds; and (c) reacting the reaction product of step (b) with an ethynyl-containing compound or an ethynyl synthon in the presence of an aryl ethynylation, preferably palladium, catalyst and an acid acceptor to simultaneously replace the halogen and the trifluoromethylsulfonate with an ethynyl-containing group (for example, acetylene, phenylacetylene, substituted phenylacetylene or substituted acetylene). Further explanation of this synthesis is provided in Babb, published PCT patent application WO 97/10193, published Mar. 20, 1997, which is incorporated herein by reference.

The ethynyl aromatic monomers of Formula (I) are useful to prepare polymers of either Formula (II) or (III). While not being bound by theory, it is believed that the ethynyl groups, specifically those of ortho orientation, on the aromatic ring cyclize upon heating, forming a dehydro aromatic ring which reacts to form a polymer chain. Monomers with more than two ortho ethynyl groups (that is, more than one set of ethynyl groups) are used to form thermoset polymers and depending on the concentration of monomer having more than one set of ortho-ethynyl groups may contain from almost none (that is, a polymer having essentially repeat units of Formula (II) only to substantial segments of linear polymer chain structure (that is, a polymer of Formula (III)).

The ethynyl aromatic monomers can be thermally polymerized. Polymerization can be detected by increasing viscosity or reaction exotherm. Polymerization will generally occur at a temperature more than 1 50° C., but polymerization temperatures are preferably at least 180° C., more preferably at least 210° C. The polymerization temperature preferably does not exceed that temperature which would result in undesirable degradation of the resulting polymer, which means polymerization is generally conducted at a temperature less than 300° C. for monomers having benzylic hydrogen atoms, and, for monomers not having a benzylic hydrogen, less than 450° C., preferably less than 400° C., more preferably less than 350° C. The polymerization temperature will vary with Ar—L—Ar and R, with smaller R groups like H generally requiring lower temperatures than larger R, and more conjugated Ar and R (when aromatic) groups requiring lower temperatures than less conjugated Ar and R groups. For instance, when R or Ar is anthracene, the polymerization is more advantageously conducted at a lower temperature than when Ar or R is phenyl.

While not being bound by theory, representative units of Formula (II) are believed to have the following structural formulae:

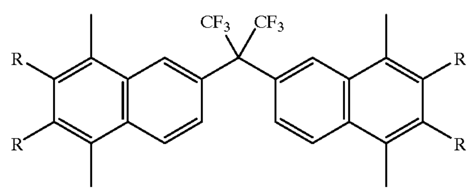

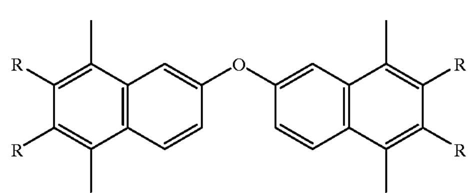

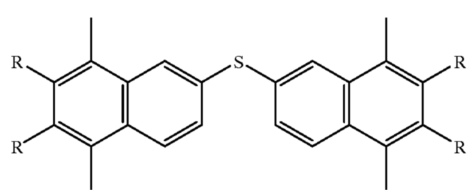

-continued

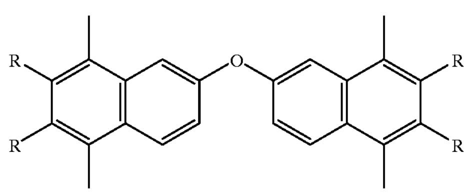

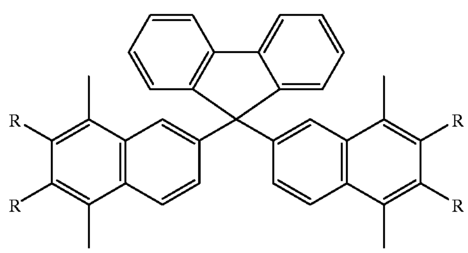

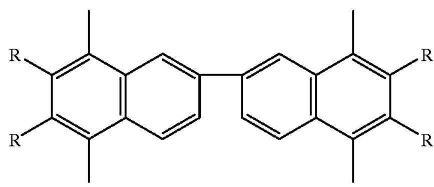

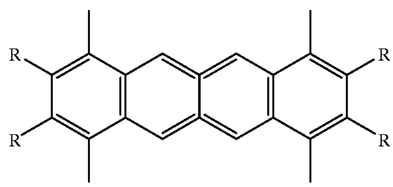

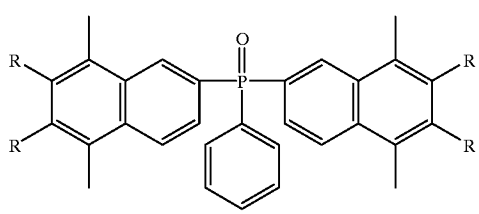

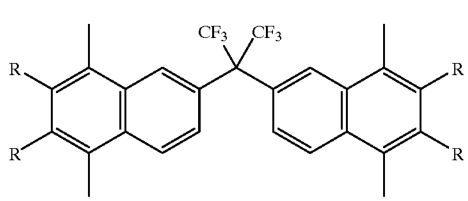

Polymerization is conveniently conducted at atmospheric pressure, but pressures higher or lower than atmospheric pressure can be employed.

The polymerization may be conducted in the presence of agents for controlling (accelerating) the cyclization reaction such as free radical initiators, or the chlorides disclosed by Warner, et al. in Science 269, pp. 814–816 (1995) can be employed in the polymerization reaction.

While not being bound by theory, it is believed that polymerization of the bis(ortho-diacethylene)-6F can be depicted as follows:

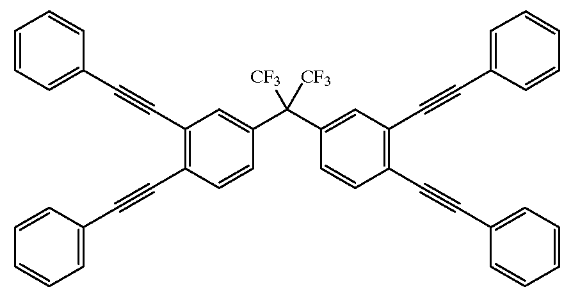

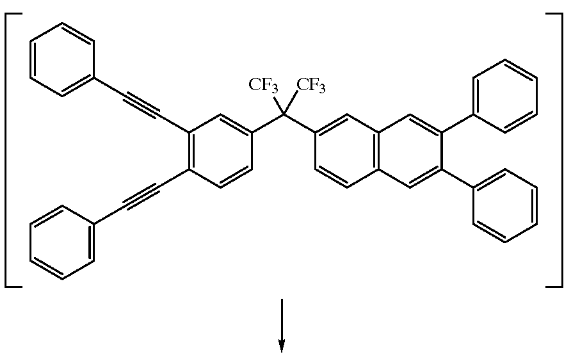

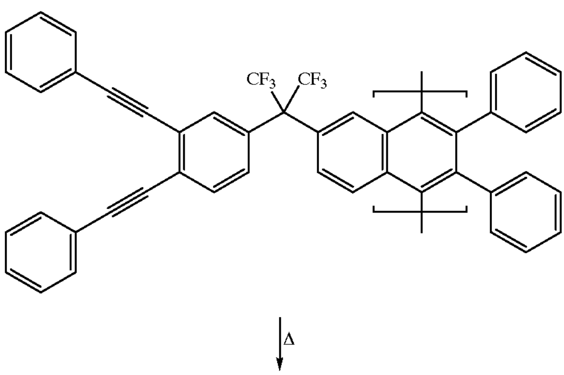

-continued

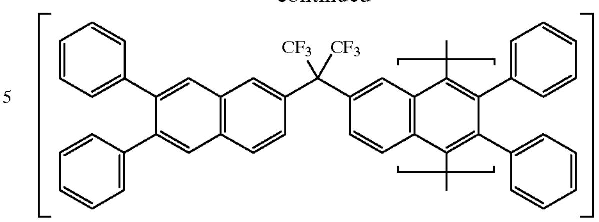

While the specific conditions of polymerization are dependent on a variety of factors including the specific ethynyl aromatic monomer(s) being polymerized and the desired properties of the resulting polymer, in general, the conditions of polymerization are detailed in Babb, published PCT application WO 97/10193 published Mar. 20, 1997, which is incorporated herein by reference.

Further examples of porous polyarylene copolymers may be found in Furuta, et al., U.S. Pat. No. 5,498,689 issued Mar. 12, 1996, which is incorporated herein by reference. Other thermosetting matrices which are useful in the invention include polyarylene ethers, polyimides, and polybenzazoles among others such as those disclosed in PCT application WO 97/01593 published Mar. 20, 1997; Burgoyne Jr. et al, U.S. Pat. No. 5,658,994, issued Aug. 19, 1997; Sovish, European Patent Specification No. 524,930, published Mar. 12, 1997; Burgoyne, European Patent Application No. 755, 957, published Jan. 29, 1997, all of which are incorporated herein by reference.

Another useful class of thermosets include those thermosets which can be used to make nanoporous cyanate networks. In this instance, the cyanate resin is polymerized to form a vitrified network in the presence of a reactive polymer based on templated polymerization.

For example, a poly($\epsilon$-caprolactone) with a 6 arm star molecule architecture (V) prepared as shown below was used to modify the bisphenol-A-cyanate (bpacy) shown below (IV). Once melted, the bpacy dissolved the polymer template without the use of a mutual solvent. The use of a solvent to mediate deposition is useful. The miscibility of the two components at the early stages of the cure precludes phase separation with solvent evaporation. As the cyanate resin cures and builds in molecular weight, it is no longer a solvent for the polyester and expels the polymer. However, the phase separation is limited since the star polymer is chemically incorporated either transiently or permanently. Upon vitrification of the cyanate (250° C. cure for 2 hours), the polymer template can be decomposed at ~350° C., leaving behind pores the same size and shape of which are identical to the initial hybrid morphology.

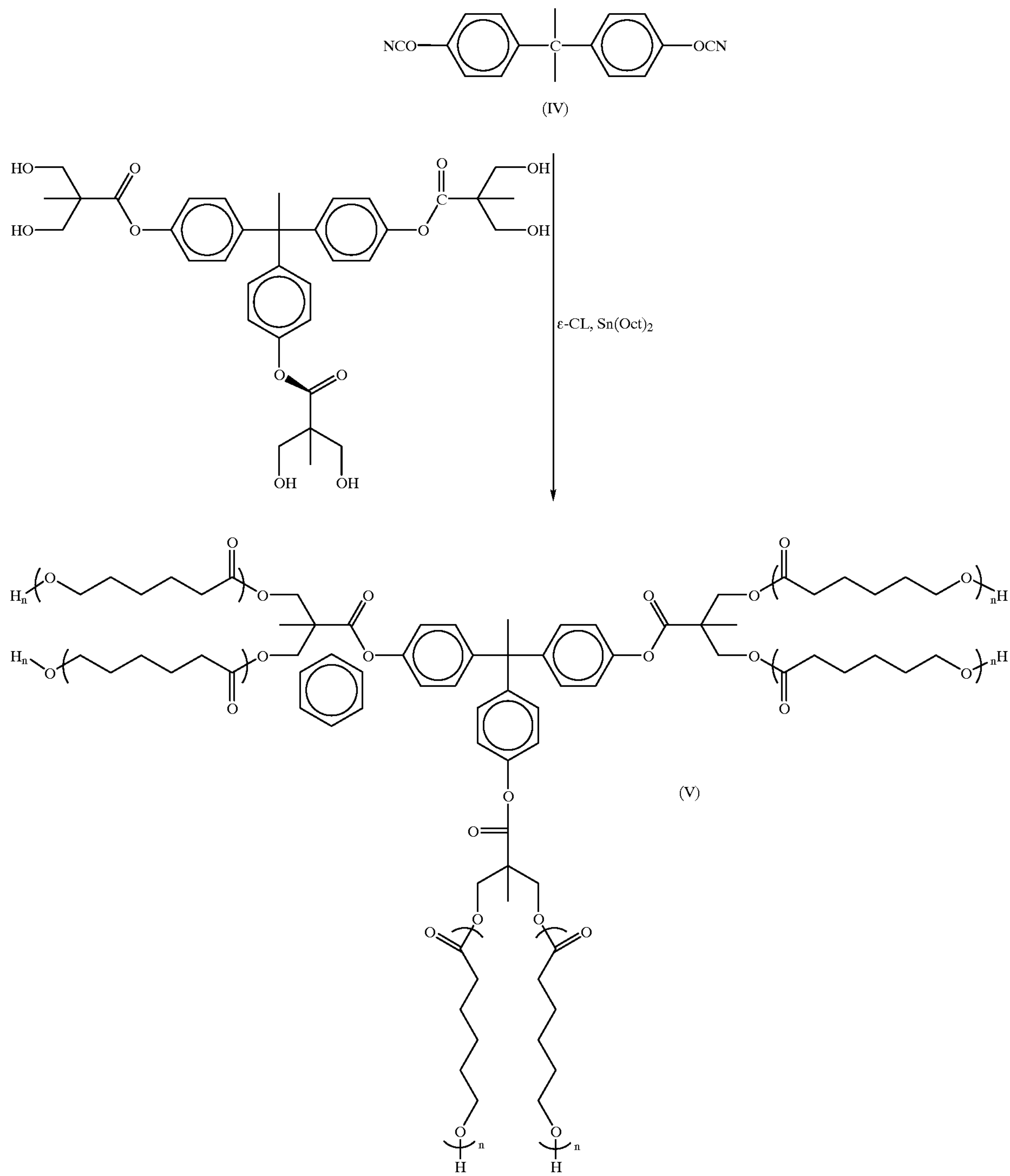

Polyisocyanurate resins are high performance polymers and play an important role as insulating materials and structural resins in manufacturing microelectronic devices and components. The material requirements for these applications generally include high thermal and dimensional stability, low thermal expansion coefficient and low dielectric constant. A low dielectric constant is of particular importance since propagation delay of electronic signals varies with the inverse of the square root of the dielectric constant and allows for denser wiring at acceptable cross-talk levels. Highly crosslinked networks possess many of the requisite properties for these applications, and epoxy resins are among the most commonly used thermosetting polymers due to their cost, availability and ease of processing.

Cyanate ester resins, an emerging class of high performance thermosetting polymers, have a low dielectric constant (about 2.6 to 3.2), a high Tg and thermal stabilities. However, due to the highly crosslinked structure, they are inherently brittle, limiting their utility in applications requiring high mechanical strength or thermal cycle resistance.

Generally, polyisocyanurates are synthesized from cyanate esters. The unique chemistry of —OCN functionality and the aryl polycyanurate network formed after cure creates distinctive features, which can be further enhanced by altering the polyphenolic backbone structures. Representative monomers useful in making the polyisocyanurates of the invention include those provided below.

POLYCYANATE MONOMER

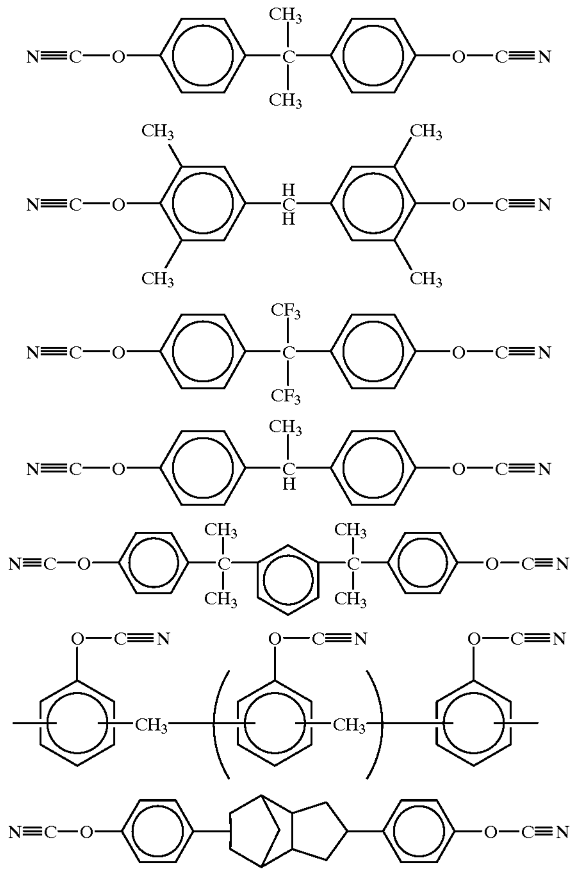

Preparation of the cyanate esters involves adding a base (e.g. triethylamine) slowly into the phenol-cyanogen halide (usually chloride in large scale preparation) solution at a temperature between −30 and 20° C. to give almost quantitative cyanation of most phenols. Exceptions are phenols bearing strong electron-withdrawing groups. Cyanation of aliphatic alcohols, on the other hand, cannot normally be done by the same procedure, due to instability of the aliphatic cyanates at ambient temperatures. Substitution of the β-hydrogen with fluorine in the precursors stabilizes the cyanate esters, thus making direct cyanation feasible. Both organic and inorganic bases can be used in cyanation. Triethylamine is preferred for its relatively high-boiling and low equivalent weight properties in scavenging the acid by-product. Insoluble inorganic bases such as NaOH possess the advantage of initiating the cyanation reaction without participating in other side reactions.

Cyanate-containing oligomers or polymers have been prepared by using the same cyanation method on the polymeric phenols. Polycarbonate dicyanate oligomers have been prepared by cyanation of the phenol-terminated polycarbonates. Poly(arylene-ether-sulfone) dicyanate have been synthesized by reacting the phenol-terminated poly(arylene-ether-sulfone) in chlorobenzene with BrCN and TEA. Cyanation of phenol-containing polymers provides an efficient means of access to cyanate macromonomers; poly(p-hydroxystyrene) for example, has been converted to poly (p-cyanatostyrene).

Other polyphenolic compounds such as the one produced by copolymerization and subsequent hydrolysis of the copolymer of p-isopropenylphenyl acetate and styrene have also been subjected to cyanation to produce atactic cyanate macromonomers. Copolymerization of cyanate-containing vinyl monomers such as p-isopropenylphenyl cyanate with long-chain acrylates provides an alternative to the hydrolysis-cyanation approach.

Oligomeric cyanate esters requiring temperatures above 60° C. to flow easily are usually recovered by precipitation from water-miscible solvents, e.g. acetone or tetrahydrofuran, by addition of water or ice. The hard resin products are either washed in water and dried in air or dissolved in low boiling solvents such as methylene chloride and spray dried. Additional monomers useful in synthesizing the cyanurate polymers of the invention include those provided below.

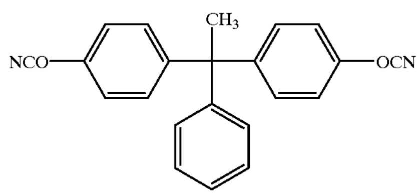

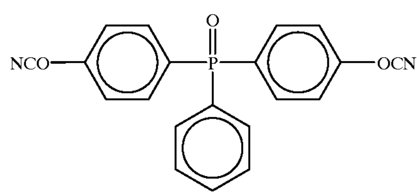

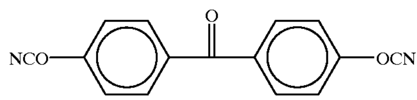

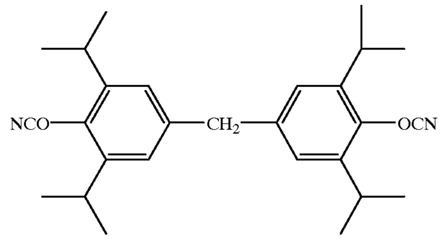

-continued

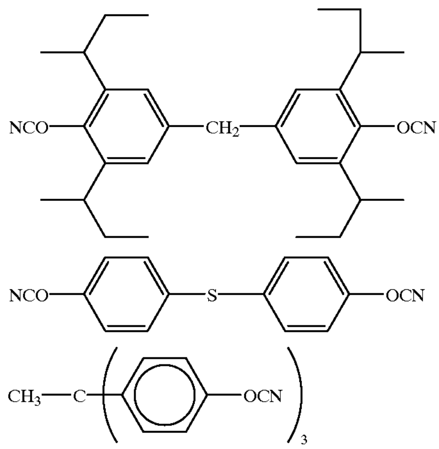

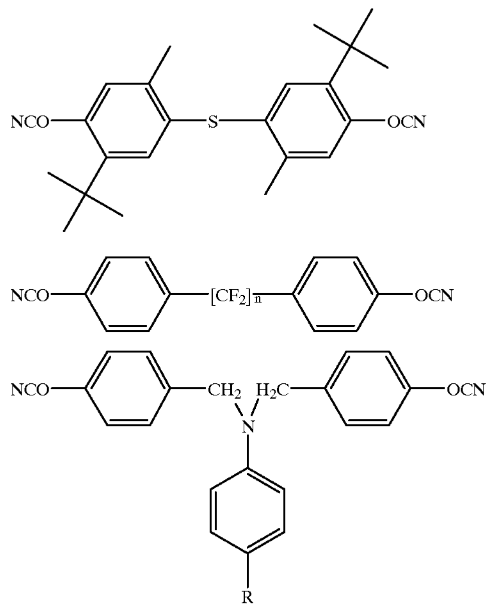

R = H, DCVAZ

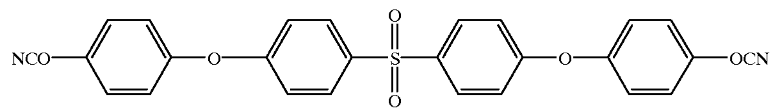

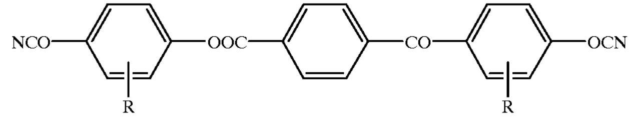

R = Cl, $CH_3$

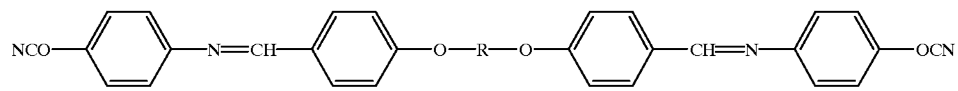

R = DEG, TEG

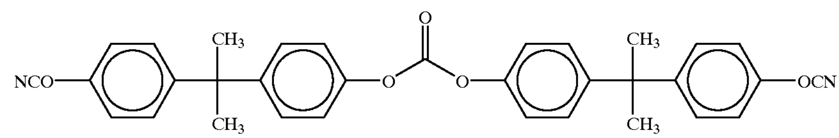

n = 4, 6, or 14

Processing

The porous organic polysilica dielectric composition is formed in a three step process. The first step involves dissolving uncondensed or partially condensed organic polysilica in a suitable high boiling solvent (for example, DMAC, propylene glycol mono methylether, propylene glycol mono methylether acetate, γ-butyroloctane, cyclohexanone cyclopentanone, γ-methoxy propionate ethyl ester, and N-methyl-2-pyrrolidone, NMP) at room temperature and then dissolving in the solution a suitable decomposable polymer. The decomposable polymer is radiation decomposable or preferably thermally decomposable. The radiation decomposable polymer decomposes upon exposure to radiation e.g., ultraviolet, x-ray, electron beam or the like. The thermally decomposable polymer undergoes thermal decomposition at a temperature above the condensation temperature of the organic polysilica. Suitable decomposable polymers are those which actively promote templating of the polymerization and/or the vitrification reaction, those which control and define pore size, and those which are fugitive at the appropriate time in the processing.

Preferably the decomposable polymer useful in the invention result from amphiphiles such as block copolymers, soaps, and lipids which are examples of amphiphiles that are capable of remarkable self-assembly into periodic geometries with long range order. Block copolymers are two distinct polymer chains covalently bound at one point, which promotes the miscibility of the two dissimilar materials and phase separation when it occurs, is limited to dimensions on the order of 100 to 400A. The amphiphilic behavior of block polymers, realized from this propensity of the polymers to phase separate coupled with the restriction of the chemical bond, allows self-assembly or micelle formation in solution. The micellization process results from the selective solubilization of one of the blocks of the block copolymer. Spherical micelles, consisting of two concentric regions, will be formed, where the interior region is comprised of the block that is insoluble and is collapsed and the outer region is comprised of the solvent swollen block.

One class of decomposable polymers are acrylates including polyacrylates and polymethacrylates. Poly(acrylates) and poly(methacrylates) can vary in polarity over a wide range depending on the nature of ester substitutents. For example poly(hydroxyethyl methacrylate) itself and random copolymers with methyl methacrylate (MMA) are much more polar than the homopolymer of MMA. Block copolymers of such materials constitute additional examples of polymer micelle forming copolymers of such materials constitute additional examples of polymer micelle forming copolymers. Other additional polar methacrylate and acrylate monomers (e.g. acrylamide, NN-dimethylacrylamide, β-dimethylaminoethyl acrylate, hydroxypropyl acrylate and the corresponding derivatives derived from methacrylic acid etc.) constitute monomer examples which can be polymerized by living free radical techniques to yield polar polymers. The use of star-branched or dendritic-like initiators such as described in the patent also produce branched block copolymers comprised of nonpolar and polar polymer blocks. For example, the 6-are star initiator TPHE (6-Br) derived from esterification of TPHE with 2-bromo-2-methylpropionyl bromide can be used to generate star-block copolymers containing PMMA as the inner core and a random copolymer of MMA/20 HEMA as the outer using ATRP controlled living polymerization techniques as described. Likewise, dendrimer-like block copolymers can be prepared from the 12-functional variant produced by initial esterfication of TPHE with the AB4 dendro derived from bis-MPA as described followed by subsequent esterification of the 12-OH derivative with 2-bromo-2-methyl propionyl bromide. This 12-arm initiator can be converted to dendrimer-like block copolymeric unimolecular micelles by sequential polymerization with nonpolar and polar acrylates and/or methacrylates respectively using ATRP techniques. The large number of available acrylate and methacrylate monomers of varying polarity make this an attractive technique for the preparation of unimolecular micelles. In addition, to the direct polymerization of polar monomers, masked derivatives may be employed (e.g. t-butyl acrylate) in the outer shell and transformed by post-polymerization liberation of the polar functionality. In the example cited, acid treatment with trifluoroacetic acid liberates the carboxy functionality from the t-butyl ester side chains. Other protection-deprotection schemes can be envisioned for other monomers where the polarity is masked during polymerization.

Further examples of these 3-dimensional macromolecular assemblies are the unimolecular, or dendritic micelles such as those disclosed in Fréchet et al., "Synthesis and Properties of Dendritic and Hyperbranched Polymers", *Comprehensive Polymer Science, Supplement* 2, Elsevier Science, Oxford, 7, 1996 which is incorporated herein by reference. In this structure the hydrophobic internal core is surrounded by a very hydrophilic layer and it is this layer which interacts strongly with various silsesquioxanes, to promote nanometer scale phase separation. Therefore mixing of the dendritic micelle with the silsequioxane followed by spin coating and initial heating to vitrification leads to a nanometer scale phase separation in which the domain size is 5–10 nm. Further heating to 425–450° C. leads to complete decomposition of the unimolecular micelle and pores are obtained, again with a size in the range of 5–10 nm. Both the internal structure and external layer of the dendrimer can be varied, for example hydroxy, phenolic, carboxy oligio(ethylene glycol) units can comprise the surface layer and in each case nanoporosity is obtained. The only criteria for selection of functional groups and repeat units is that complete decomposition must occur by 425–450° C. with no residue.

A further example of a class of 3-dimensional macromolecular assemblies are crosslinked polymeric micelles, either core crosslinked or shell crosslinked, includes shell-crosslinked polymeric micelles, such as those disclosed in Thurmond et al., J. Am. Chem. Soc., 1997, 119, 6656 and references therein, while references for core-crosslinked polymeric micelles can be found in Thurmond et al. J. Am. Chem. Soc., 1996, 118, 7239, Wooley, Chem. Eur. J. 1997, 3, 1397 and references therein which are all incorporated herein by reference. These materials are prepared by taking hydrophilic/hydrophobic block copolymers, self assembling these systems in a polar or aqueous or other polar environment and then crosslinking either the interior (core) or exterior (shell) of the polymeric micelle. Like the dendritic micelles above, they are static, covalently bound structures with a hydrophilic exterior and hydrophobic interior and their size can be accurately controlled by the initial size of the block copolymers.

The functionality of the exterior layer can be varied to maximize interaction with the thermosetting matrix, i.e. various silsesquioxanes, in order to promote nanometer scale phase separation. Mixing of the thermosetting material with the decomposable polymer in the appropriate proportions results in phase separation in which the domain size is 5–10 nm. Further heating to 425–450° C. leads to complete decomposition of the crosslinked polymeric micelle and pores are obtained, again with a size in the range of 5–10 nm. Again the only criteria for selection of functional groups and repeat units is that complete decomposition must occur by 425–450° C. with no residue.

A characteristic of these copolymers generally is complex, compact molecular geometries. The domain size of the copolymer preferably can be correlated to the ultimate pore size obtained. For example, with six-arm star copolymer a DP of about 4 to 6 provided phase domains of less than 100 Å, a DP of about 20–30 results in phase domains of about 250 to 750 Å, and a DP of 30 or greater results in a macro phase system. That is the volume fraction of copolymer charged combined with copolymer domain size correlates to the ultimate pore size. Preferably, the pore size is less than about 500 Å, more preferably less than about 100 Å, and most preferably ranges about 30 Å to 50 Å. This smaller pore size allows the application of a more consistent environment from device to device. The decomposable polymers useful in the invention generally have a molecular weight (Mn) of less than about 20,000, preferably less than about 10,000, and more preferably about 5000 or less. Preferably, the resulting system comprises about 40 vol-% porosity or less and more preferably 20 to 25 vol-% porosity or less, the volume of porosity generally being substantially equivalent to the volume of fugitive polymer in the system before decomposition.

Suitable decomposable polymers also include those disclosed in Tomalia et al., U.S. Pat. Nos. 5,527,524 and 5,338,532, as well as Newkome et al., U.S. Pat. Nos. 5,136,096 and 5,154,853, and Turner et al., U.S. Pat. No. 5,196,502 all of which are incorporated herein by reference. Preferably these decomposable polymers have low solution viscosity, high chemical reactivity due to surface functionality and enhanced solubility even at higher molecular weights. Suitable polymers for use in the present invention will be known to those skilled in the art such as disclosed in "Comprehensive Polymer Science", 2nd Supplement, Aggarwal, pages 71–132 (1996), the disclosure of which is incorporated herein by reference for all purposes.

In the second step of the process of the present invention, the mixture of the organic polysilica and decomposable polymer is heated to an elevated temperature e.g., directly or in a step wise fashion (e.g., 200° C. for 2 hrs. and then ramped up (5° C./min.) to 300° C. and held for 2 hrs.) to cause condensation of the organic polysilica and preferably cross condensation with the reactive groups of the thermally decomposable polymer. The heating in the second step is below the thermal decomposition temperature of the decomposable polymer. A catalyst may be utilized to lower the condensation temperature.

The last step of the process of the invention involves decomposing the decomposable polymer uniformly dispersed within the matrix of the condensed rigid organic polysilica. Photochemical labile polymers can be decomposed by exposure of the composition to suitable radiation to cause photodecomposition. Thermally decomposable polymer is decomposed by heating the composition to a temperature at or above the thermal decomposition temperature of the polymer. (e.g., about 350–400° C.)

The polymer decomposes to volatile fragments which diffuse out of the rigid polysilica matrix leaving voids behind. The pore size in the polysilica matrix will be generally approximately the same size as the size of the domains of the decomposable polymer and the pore size can be altered by varying the molecular weight and structure of the decomposable polymer.

The dielectric composition of the invention has a dielectric constant less than about 3.2 and preferably less than about 2.8 at 25° C. The composition comprises about 10 to 40% by volume of pores and has pore sizes less than 500 Å, preferably less than 100 Å, which result in enhanced mechanical toughness and crack resistance and isotropic optical properties and improved dielectric properties.

Further, the dielectric composition has mechanical properties that resist cracking and enable it to be chemically/mechanically planarized to facilitate lithographic formation of additional circuit levels in multilevel integrated circuit devices. The dielectric composition has a dielectric strength from 1–5 MV/cm. The dielectric composition is optically clear and adheres well to itself and other substrates. The dielectric composition undergoes minimal shrinkage after removal of the solvent during heating. The composition of the invention can also be utilized as a protective coating for optical articles such as glasses, contact lens and solar reflectors and other articles used in outer space.

APPLICATION

Figure 2:
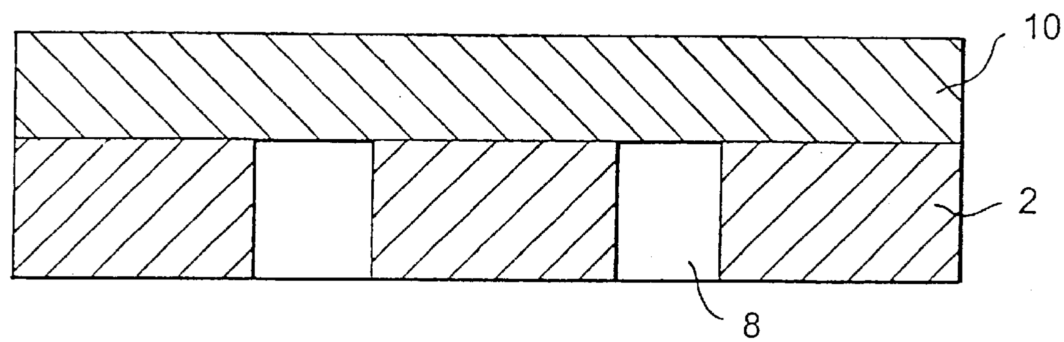
FIGS. 2–5 show a process for making the integrated circuit device of the present invention.

The invention relates to processes for manufacturing the integrated circuit device. Referring to FIG. 2, the first step of one process embodiment involves disposing on a substrate 2 a layer 10 of the dielectric composition of the invention comprising organic polysilica and decomposable polymer. The substrate 2 is shown with vertical metallic studs 8. The composition is dissolved in a suitable solvent such as dimethyl propylene urea (DMPU), NMP, PM acetate, PM alcohol, γ-butyrolactone, or the like and is applied to the substrate by art known methods such as spin or spray coating or doctor blading. The second step of the process involves heating the composition to an elevated temperature to cross condense the polysilica silyl reactive groups. Preferably, the composition is heated in the presence of a catalyst like an alkaline agent such as an amine or Bronsted base to lower the condensation temperature.

The base catalyzes both condensation extension of the polysilica and any cross condensation with the decomposable polymer enabling a lower initial cure temperature. Suitably, the base is an organic amine. The amine will preferably have a high boiling point and is removable by heating upon completion of the reaction. A suitable base is N-methyldiethanolamine. Other suitable bases will be known to those skilled in the art such as disclosed in U.S. Pat. No. 5,206,117, the disclosure of which is incorporated herein by reference for all purposes. The last step involves decomposing the decomposable polymer dispersed within the rigid polysilica matrix to form the porous polysilica.

Figure 3:
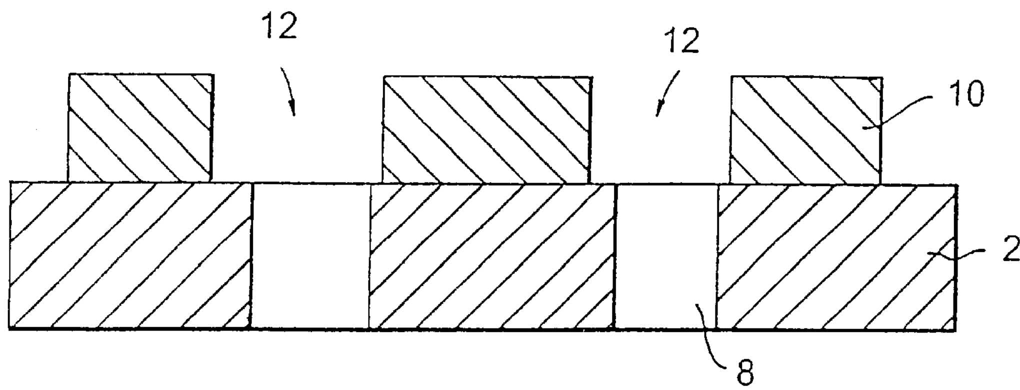

Referring to FIG. 3, the next step of the process involves lithographically patterning the layer 10 of dielectric composition to form trenches 12 (depressions) in the layer of composition. The trenches 12 shown in FIG. 3 extend to the substrate 2 and to the metallic stud 8. Lithographic patterning generally involves (i) coating the layer 10 of dielectric composition with a positive or negative photoresist such as those marketed by Shipley or Hoechst Celanese (AZ photoresist), (ii) imagewise exposing (through a mask) the photoresist to radiation such as electromagnetic e.g., visible UV or deep UV, vacuum UV, x-ray etc.

(iii) developing the image in the resist e.g., with suitable basic developer and (iv) transferring the image through the layer 10 of dielectric composition to the substrate 2 with a suitable transfer technique such as reactive ion etching (RIE). Suitable lithographic patterning techniques are well known to those skilled in the art such as disclosed in "Introduction to Microlithography", Thompson et al., (1994), the disclosure which is incorporated herein by reference for all purposes.

Figure 4:
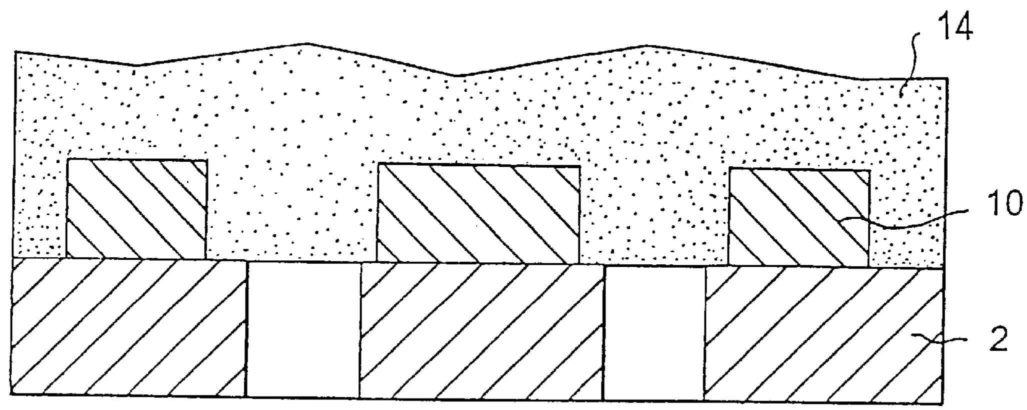

Referring to FIG. 4, in the next step of the process for forming the integrated circuit of the invention, a metallic film 14 (and removing excess metal) is deposited onto the patterned dielectric layer 10. Preferred metallic materials include copper, tungsten and aluminum. The metal is suitably deposited onto the patterned dielectric layer by art known techniques such as chemical vapor deposition (CVD), plasma enhanced CVD, electro and electroless deposition, sputtering or the like.

Figure 5:
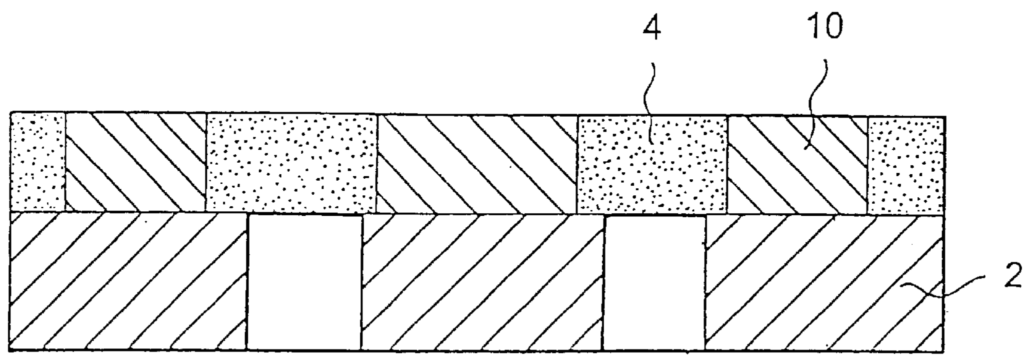

Referring to FIG. 5, the last step of the process involves removal of excess metallic material (e.g., planarizing the metallic film 14) so that the features 14 are generally level with the patterned dielectric layer 10. Planarization can be accomplished using chemical/mechanical polishing or selective wet or dry etching. Suitable chemical/mechanical polishing techniques will be known to those skilled in the art.

Figure 6:
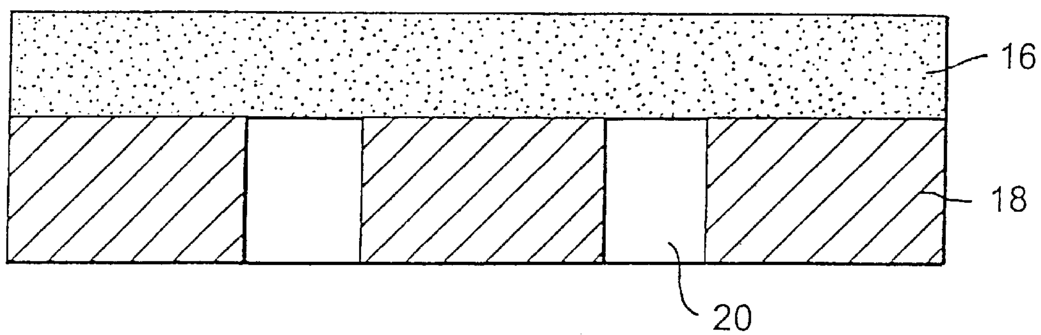
FIGS. 6–8 show an alternative process for making the integrated circuit device of the present invention.
Figure 7:
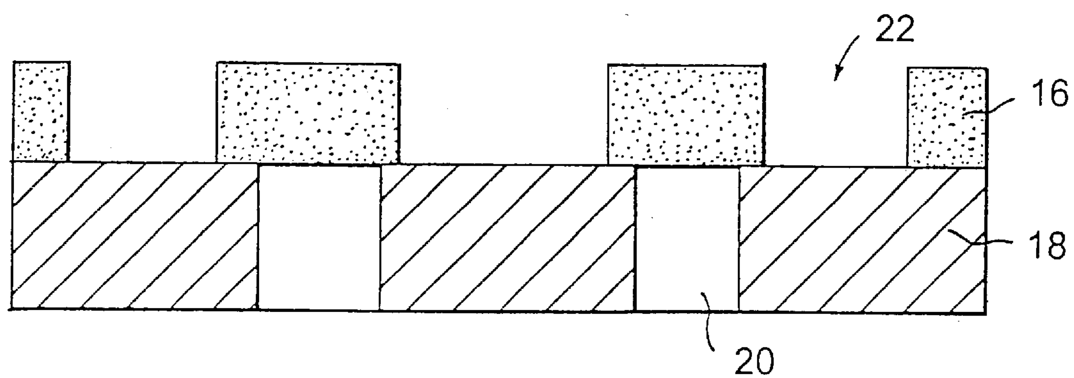
Figure 8:
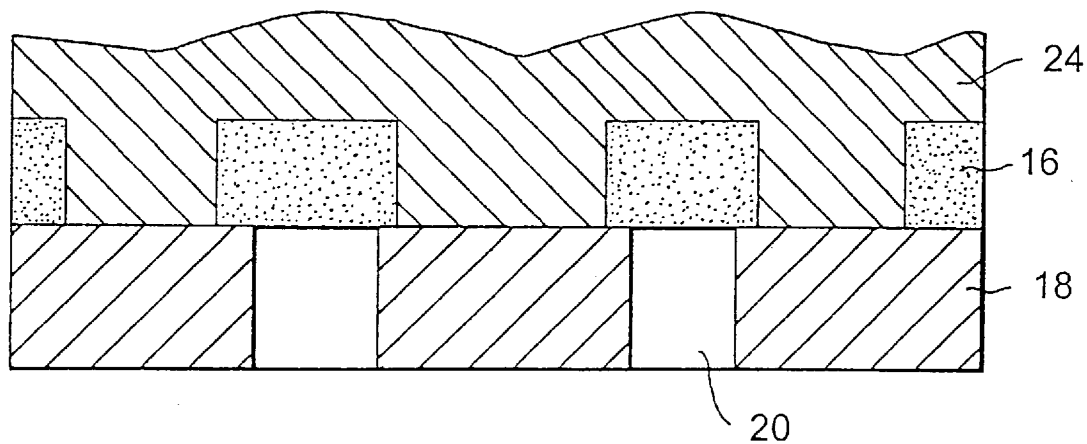

Referring FIGS. 6–8, there is shown an alternative embodiment of the process of the invention for making the integrated circuit devices. The first step of the process in this embodiment involves depositing a metallic film 16 onto a substrate 18. Substrate 18 is also provided with vertical metallic studs 20. Referring to FIG. 7, in the second step of the process, the metallic film is lithographically patterned through a mask to form trenches 22. Referring to FIG. 8, in the next step of the process, a layer 24 of dielectric composition of the present invention is deposited onto the patterned metallic film 16. In the last step of the process, the composition is heated first to condense the polysilica and then at a higher temperature to decompose the thermally decomposable polymer. Optionally, the dielectric layer may then be planarized for subsequent process in a multilayer integrated circuit.

WORKING EXAMPLES

The following examples are detailed descriptions of the process of the invention. The detailed preparations fall within the scope of, and serve to exemplify, the more generally described methods set forth above. The examples are presented for illustrative purposes only, and are not intended as a restriction on the scope of the invention.

Precursors for the vitreous matrices, including spin-on-glasses, silsesquioxanes (SSQ) etc. are commercially available. The 2,2-bis(hydroxymethyl) propionic acid (bis-MPA), benzyl chloride, benzaldehyde dimethyl acetal, p-toluene sufonic acid (p-TSA), tert-butyldimethylsilyl chloride (TBDMSicl), imidazole, silica gel, Pd/C (10 wt %), 2,2-dimethoxypropane 1,3-dicyclohexyl carbodiimide (DCC), triphenylphosphine (TPP), 4-dimethylamino pyridine (DMAP) and tetrahydrofuran (THF) (dry) were all purchased from Aldrich and used as delivered. The 1,1,1-tris (p-hydroxyphenyl)ethane (THPE) (Hoechst Celanese) and stannous (II) 2-ethylhexanoate ($SN(Oct)_2$) (Sigma), were purchased and used as delivered. The 4-(dimethylamino) pyridinium 4-toluenesulfonate (DPTS) was synthesized according to a literature procedure.

The $\epsilon$-caprolactone was dried over $CaH_2$ (Mallinckrodt) and distilled and stored under $N_2(g)$ prior to use. Toluene was dried over Na, distilled and stored under $N_2(g)$. The methyl methacrylate (Aldrich) was distilled under vacuum and stored under $N_2$ cold until used. The hexahydroxyl initiator was prepared according to a literature procedure. The benzyl 2,2-bis(hydroxymethyl) propionate was synthesized according to a literature procedure.

The functional dendrons or $AB_x$ monomers were prepared according to a literature procedure. The methacrylate functional ethylene oxide oligomers were dried with magnesium sulfate prior to use. The six arm star poly(caprolactone) was prepared according to a literature procedure. The poly (caprolactone) prepared had a molecular weight of 14,600 g/mol with an average DP per arm of 20. A Mitsunobu reaction (which is an organic name reaction using azodiformates and phosphines for condensation synthesis of esters, amides, imides, among others) was used to couple the $AB_2$ and $AB_4$ functional dendrons to the six arm star poly (caprolactone) according to literature procedures.

Measurements

Analytical TLC was performed on commercial Merck plates coated with silica gel GF254 (0.25 mm thick). Size-exclusion chromatography (SEC) was carried out on a Waters chromatograph connected to a Waters 410 differential refractometer. Four 5 $\mu$m Waters columns (300×7.7 mm) connected in series in order of increasing pore size (100, 1000, $10^5$, $10^6$ Å) were used with THF as solvent. The SEC was calibrated with polystyrene. The thermophysical properties (e.g. Tg) were recorded on a Perker-Elmer DSC-7. $^1$H-NMR spectra were recorded in a solution with a Bruker AM 250 (250 MHz) spectrometer. $C^{13}$-NMR spectra were recorded at 62.9 MHz on a Bruker AM 250 spectrometer with the solvent carbon signal as an internal standard.

Polymer Synthesis

The synthesis of the six arm star poly($\epsilon$-caprolactone) was accomplished by the ring opening polymerization (ROP) of $\epsilon$-caprolactone monomer initiated from a hexahydroxyl functional initiator in the presence of $Sn(Oct)_2$. This hexahydroxyl functionalized initiator was the first generation dendrimer derived from 2,2'-bis(hydroxymethyl) propionic acid (bis-MPA). Bulk polymerization conditions (100° C.) produced a polymer with controlled molecular weight and low polydispersity, and hydrolysis of the active metal bonds produced the desired hydroxyl chain ends. The number average molecular weight of the star polymer was 14,500 g/mol and is referred to as G-1(6-OH) (in Table 1), denoting the first generation of poly($\epsilon$-caprolactone) containing six hydroxyl functional groups. The target degree of polymerization for each arm of 6-1(6-OH) was 20, and the average degree of polymerization, DP, calculated by $^1$H-NMR was 21. The polydispersity, as measured by size exclusion chromatography, was below 1.1.

In some instances, a branching junction was introduced to the chain ends by the derivatization with an $AB_x$ monomer or dendron. $AB_2$ or $AB_4$ protected bis-MPA derivatives were employed which allows six arm polymers with either twelve or twenty-four hydroxyl groups, respectively, to be prepared. The first example is simply bis-MPA in which the hydroxyl groups are protected with a benzylidine group. The synthesis of the $AB_4$ monomer was accomplished by the convergent growth approach as previously reported. Mitsunobu condensation conditions were used to couple the $AB_2$ and $AB_4$ nonomers to the six arm star poly($\epsilon$-caprolactone) to produce G-1.5(12-OH) and G-1.5(24-OH), respectively, and the transformations were followed by $^1$H-NMR, $^{13}$C-NMR and SEC measurements.

The polymerization of MMA by a controlled atom transfer procedure requires an initiator with an activated alkyl halide, such as an a-haloester. Introduction of these initiating centers into the dendritic structure was accomplished by the esterification of the hydroxyl functional chain ends of G-1 (6-OH), G-1.5(12-OH) and G-1.5(24-OH) with 2-bromo-2-methylpropionyl bromide in THF in the presence of triethylamine (Scheme 1). Isolation of the chain end functionalized polymers or "macro-initiators" (denoted as G-1(6-Br), G-1.5 (12-Br), and G-1.5(24-Br)) and purification from excess reagents was accomplished by a simple precipitation in methanol.

The copolymerization of MMA and HEMA using a variety of activated bromides as initiators has been shown to be controlled process in the presence of metal catalysts such as $NiBr_2(PPh_3)_2$. While MMA/HEMA mixtures are good solvents for the poly(caprolactone) macroinitiators at moderate compositions of HEMA, allowing bulk polymerization conditions, higher compositions of HEMA (i.e., 20 wt %) requires the use of a solvent (such as THF). Likewise, ethylene oxide macromonomer/MMA mixtures with moderate (i.e., <15%) poly(ethylene oxide) macromonomer compositions solubilize the poly(caprolactone) macro-initiators. Higher compositions require a solvent such as THF or toluene to facilitate miscibility. The Ni(II)-based catalysts have been shown to be active under mild conditions in organic solvents such as THF, toluene etc. Generally, ATRP catalysts are used in near stoichiometric amounts relative to the activated bromide, however, controlled polymerization is possible with a $NiBr_2(PPh_3)_2$ content as low as 10 to 20% of the stoichiometric amount. In this study, the poly(caprolactone) macroinitiator and $NiBr_2(PPh_3)_2$ (20 mol percent) were charged into the flask and evacuated and back filled with nitrogen six times. The flask was placed in an oil bath heated to 100° C., where the poly(caprolactone) melted. To this flask, the monomers or a mixture of monomers and solvent were added. In the case when THF was used as a solvent, the oil bath temperature was restricted to 80° C. The polymerization times varied from several hours to overnight depending on the solids and catalyst contents, and completion of polymerization was determined by the point when the reaction mixture either vitrified or became extremely viscous. The polymers were dissolved in THF and isolated in either heptane or hexane and reprecipitated into methanol to afford a white powder.

This general procedure was applied to each of the six arm star macro-initiators containing six, twelve and twenty-four functional groups. The target degree of polymerization, (DP), for the second generation of polymer was in the proximity of 110 or a molecular weight of approximately 10,000 g/mol. The SEC traces for the poly(ϵ-caprolactone) macro-initiator and two of the dendrimer-like star polymers prepared showed high molecular weight, low polydispersity products were obtained. The characteristics of the polymers synthesized are shown in Table 1, below. The number average molecular weights, determined by SEC analysis relative to polystyrene standards, range from 59,000 to 120,000 g/mol, depending on the number of arms. The average molecular weight per arm was approximately 10,000 g/mol and those samples with the twelve and twenty-four arms had higher overall molecular weight.

methacrylate-based tethered arms was investigated. The block copolymers were dissolved in 1,4-dioxane and hydrolyzed with HCL to give the cleaved polymer. Analysis by $^1$H-NMR shows the disappearance of the ϵ-caprolactone resonances and only the resonances of the methacrylate tethered arms remain, consistent with hydrolysis of the core. Commensurate with these results, a significant decrease in molecular weight, as determined by SEC using polystyrene standards, from 80,000 to 20,000 g/mol was observed.

For example, macromolecular unimolecular micelles can also be prepared by consecutive polymerization of MMA and MMA-HEMA by ATRP procedures using polyfunctional initiators. In fact, any combination of controlled polymerization techniques which can be applied to polarity distinguished monomers initiated from a multifunctional initiator to produce block copolymers could be used to produce unimolecular micelles. We have described ROP/ATRP and demonstrated ATRP/ATRP. Other possible combinations would be anionic/ATRP, anionic/ROP, anionic/living free radical (LFRP), ATRP/LFRF, ROP/LFRP etc.

TABLE 1

Characteristics of Dendriver-Like Star Block Copolymers

| | | | | | | | Thermal Analysis | | |
|---|---|---|---|---|---|---|---|---|---|
| | | | | | | | First Generation | | Second Generation |
| Sample Entry | Macro Initiators | Poly Condition | MNA & Comonomer (type & Wt. %) Comonomer Type & Wt. % | Targeted Degree of polymerization for 2$^{nd}$ Generating DP | Total $\langle M_n \rangle$ g/mol (SEC) | $\langle M_w \rangle / \langle M_n \rangle$ | Polyco-prolacton Tg ° C. | Tm ° C. | MNA Copolymer Tg, ° C. |
| G-2(6-Br)-1 | G-1.5(6-Br) | Bulk | HEMA(10%) | 120 | 60,000 | 1.45 | −65 | 40 | −65,100 |
| G-2(6-Br)-2 | G-1.5(6-Br) | Bulk | HEMA(20%) | 120 | 59,000 | 1.5 | — | 41 | 90 |
| G-2(6-Br)-3 | G-1.5(6-Br) | THF | HEMA(27%) | 120 | 71,000 | 1.19 | — | — | — |
| G-2(12-Br)-1 | G-1.5(12-Br) | Bulk | HEMA(10%) | 120 | 96,000 | 1.17 | — | — | 90 |
| G-2(12-Br)-2 | G-1.5(12-Br) | THF | HEMA(20%) | 120 | 92,000 | 1.18 | — | — | 90 |
| G-2(24-Br)-1 | G-1.5(24-Br) | Bulk | HEMA(25%) | 110 | — | — | — | — | — |
| G-2(6-Br)-4 | G-1.5(6-Br) | Bulk | EO-400(10%) | 113 | 78,000 | 1.31 | — | — | — |
| G-2(6-BR)-5 | G-1.5(6-Br) | Toluene | EO-400(20%) | 113 | 85,000 | 1.22 | — | — | — |
| G-2(6-BR)-6 | G-1.5(6-Br) | Toluene | EO-400(30%) | 103 | 75,000 | 1.34 | −65 | 49 | 60–80 |
| G-2(12-BR)-3 | G-1.5(12-Br) | Toluene | EO-400(25%) | 105 | 120,000 | 1.2 | — | — | 45 |
| G-2(6-BR)-7 | G-1.5(6-Br) | Bulk | EO-1000(10%) | 100 | 70,000 | 1.24 | — | — | 80 |
| G-2(6-BR)-8 | G-1.5(6-Br) | Toluene | EO-1000(30%) | 100 | 60,000 | 1.17 | −55 | 30 | 70 (Broad) |
| G-2(12-Br)-4 | G-1.5(12-Br) | Toluene | EO-1000(30%) | 105 | 116,000 | 1.09 | −60 | 45 | 60 |

Polymerization from G-1(6-Br) ultimately produces a six arm star diblock copolymer, whereas polymerization from G-1(12-Br) and G-1(24-Br) produces a dendrimer-like star molecular architecture. The highly branched structure causes the latter samples to assume a more globular in shape, typical of traditional dendritic materials. The difficulty in interpreting the solution characterization is exacerbated by the effects on the hydrodynamic volume caused from the addition of either hydrophilic HEMA comonomer or the ethylene oxide macromonomers. In the latter case, an extremely complex molecular architecture, denoted as dendrimer-like star-graft copolymers, is obtained.

Nonetheless, at these catalyst concentrations, high molecular weight polymer was found and the polydispersities were surprisingly narrow, symmetrical and monomodal, with no evidence of radical-radial coupling reactions. Polymerization in either toluene or THF had a minimal affect on the molecular weight or molecular weight distribution of the final polymers provided the initial solids composition was high (>70% solids). Similar results have been reported for nitroxide mediated polymerizations. To understand more about the polymerization and the copolymer formed, cleavage of the dendrimer-like star polymer to give the individual Although this invention has been described with respect to specific embodiments, the details thereof are not to be construed as limitations for it will be apparent that various embodiments, changes, and modifications may be resorted to without departing from the spirit and scope thereof, and it is understood that such equivalent embodiments are intended to be included within the scope of this invention.

The claimed invention is:

1. An insulative matrix material useful in microcircuit applications comprising an amphiphilic unimolecular polymeric micelle decomposable polymer and a dielectric material formed of an organic polymer wherein, upon heating, said organic polymer dielectric material condenses and said polymeric micelle decomposes and forms a plurality of nanoscopic voids surrounded by a condensed dielectric material matrix.

2. A material in accordance with claim 1 wherein said polymeric micelle is a polymer having a star architecture.

3. A material in accordance with claim 1 wherein said polymeric micelle is a polymer having a hyperbranched structure.

4. A material in accordance with claim 1 wherein said polymeric micille is a polymer having a dendritic structure.

5. A material in accordance with claim 1 wherein said nanoscopic voids have a size in a range of between about 10 Å to about 500Å.

6. A material in accordance with claim 1 wherein said nanoscopic voids provide a porosity of about 10 volume % to about 40 volume %.

7. A material in accordance with claim 6 wherein said nanoscopic voids provide a porosity of no more than about 25 volume %.

8. A material in accordance with claim 1 wherein said polymeric micelle has a hydrophobic core and a hydrophilic shell and said organic polymer dielectric material is an organic polysilica.

9. A material in accordance with claim 1 wherein said polymeric micelle has a hydrophilic core and a hydrophobic shell and said organic polymer dielectric material is a polymer selected from the group consisting of polyimides, polyarylenes, polyarylene ethers and polycyanurates.

10. A material in accordance with claim 9 wherein said dielectric material is a polyarylene.

* * * * *

UNITED STATES PATENT AND TRADEMARK OFFICE
CERTIFICATE OF CORRECTION

PATENT NO. : 6,399,666 B1
DATED : June 4, 2002
INVENTOR(S) : Craig J. Hawker et al.

It is certified that error appears in the above-identified patent and that said Letters Patent is hereby corrected as shown below:

Column 5,
Line 1, insert -- 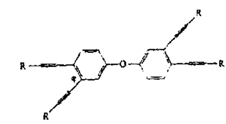 --

Column 9,
Lines 31-42, " 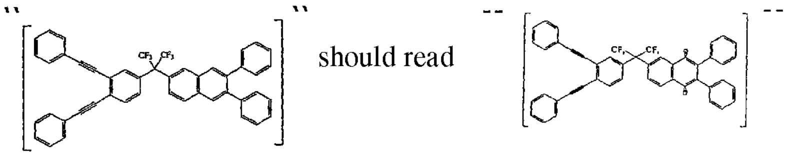 " should read -- 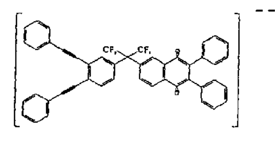 --

Column 10,
Lines 2-9, " 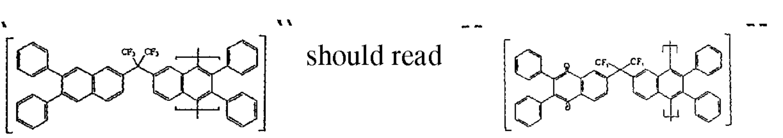 " should read -- 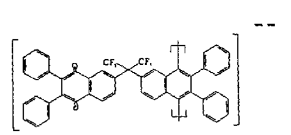 --

Column 11,
Line 33, " 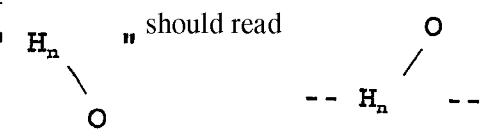 " should read -- 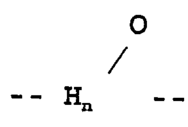 --

Signed and Sealed this

Twenty-ninth Day of October, 2002

*Attest:*

JAMES E. ROGAN

*Attesting Officer* *Director of the United States Patent and Trademark Office*